United States Patent
Chen et al.

(10) Patent No.: US 11,313,904 B2
(45) Date of Patent: Apr. 26, 2022

(54) TESTING DEVICE AND TESTING METHOD

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Yen-Chung Chen, Hsinchu (TW); Tsai-Ming Yang, Hsinchu (TW); Po-Shing Yu, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 232 days.

(21) Appl. No.: 16/693,358

(22) Filed: Nov. 24, 2019

(65) Prior Publication Data
US 2021/0156916 A1    May 27, 2021

(51) Int. Cl.
*G01R 31/317* (2006.01)

(52) U.S. Cl.
CPC .. *G01R 31/31716* (2013.01); *G01R 31/31704* (2013.01)

(58) Field of Classification Search
None
See application file for complete search history.

(56) References Cited

U.S. PATENT DOCUMENTS

| | | | | |
|---|---|---|---|---|
| 7,952,376 | B1* | 5/2011 | Yu Kasnavi | G01R 31/31715 324/762.01 |
| 8,230,281 | B2* | 7/2012 | Narayan | G01R 31/318572 714/727 |
| 9,312,910 | B1* | 4/2016 | Chen | H03M 9/00 |
| 10,567,124 | B2* | 2/2020 | Kim | H04L 1/244 |
| 2005/0285620 | A1* | 12/2005 | Wehage | G01R 31/3008 326/16 |
| 2007/0104111 | A1* | 5/2007 | Kakizawa | G01R 31/31716 370/249 |
| 2010/0262877 | A1* | 10/2010 | Narayan | G01R 31/318572 714/727 |
| 2012/0081138 | A1* | 4/2012 | Sul | G01R 31/31716 324/750.3 |
| 2016/0216319 | A1* | 7/2016 | Na | G11C 29/1201 |
| 2018/0359060 | A1* | 12/2018 | Kim | G06F 11/221 |

FOREIGN PATENT DOCUMENTS

CN    109032856 A  * 12/2018  ............. H04L 1/244

* cited by examiner

*Primary Examiner* — Jermele M Hollington
(74) *Attorney, Agent, or Firm* — CKC & Partners Co., LLC

(57) ABSTRACT

A testing device includes a transmitter circuit, a receiver circuit, and a loopback circuit. The transmitter circuit is configured to receive a plurality of first test signals. The receiver circuit is configured to receive input data from a plurality of pads in a normal mode. The loopback circuit is coupled to the plurality of pads and input terminals of a sampler circuit, and the loopback circuit is configured to transmit the plurality of first test signals from the transmitter circuit to the input terminals of the sampler circuit, in order to generate test data for subsequent analysis.

16 Claims, 4 Drawing Sheets

… (1)

TESTING DEVICE AND TESTING METHOD

BACKGROUND

Technical Field

The present disclosure relates to a testing device. More particularly, the present disclosure relates to a testing device and a testing method for loopback test.

Description of Related Art

Integrated circuits may be connected with each other via high-speed serial interfaces. In practical applications, high-speed serial interfaces typically include an input/output (I/O) circuit. A test signal may be applied to transmitter pads of an I/O circuit and may be looped back to receiver pads of the I/O circuit, in order to identify defects in the I/O circuit. In current approaches, in order to perform such test, an additional multiplexer is required to be coupled to the receiver. As a result, the performance of the receiver is degraded due to impacts from extra capacitance and resistance of the additional multiplexer.

SUMMARY

Some aspects of the present disclosure are to provide a testing device that includes a transmitter circuit, a receiver circuit, and a loopback circuit. The transmitter circuit is configured to receive a plurality of first test signals. The receiver circuit is configured to receive input data from a plurality of pads in a normal mode. The loopback circuit is coupled to the plurality of pads and input terminals of a sampler circuit, and the loopback circuit is configured to transmit the plurality of first test signals from the transmitter circuit to the input terminals of the sampler circuit, in order to generate test data for subsequent analysis.

Some aspects of the present disclosure are to provide to a testing method that includes the following operations: receiving, by a transmitter circuit, a plurality of first test signals; and transmitting, by a loopback circuit, the plurality of first test signals from the transmitter circuit to input terminals of a sampler circuit, in order to generate test data for subsequent analysis, in which the loopback circuit is coupled to a plurality of pads corresponding to a receiver circuit and the input terminals of the sampler circuit.

As described above, the testing device and the testing method provided in some embodiments of the present disclosure are able to be applied for loopback high-speed data transmission.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present embodiments. Furthermore, for simplifying the drawings, some of the conventional structures and elements are shown with schematic illustrations.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other.

In this document, the term "circuitry" may indicate a system formed with one or more circuits. The term "circuit" may indicate an object, which is formed with one or more transistors and/or one or more active/passive elements based on a specific arrangement, for processing signals.

Figure 1:
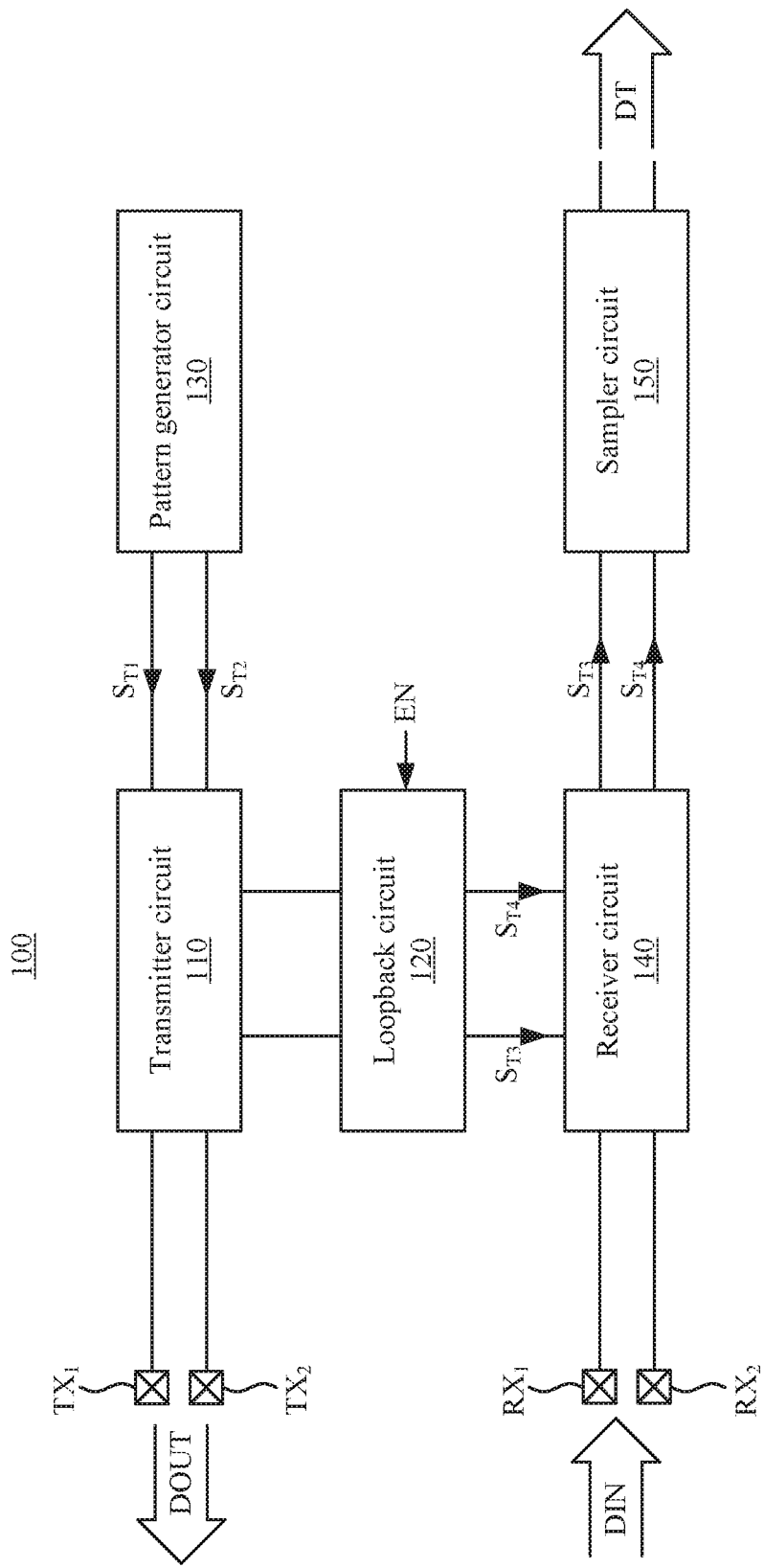
FIG. 1 is a schematic diagram of a testing device according to some embodiments of the present disclosure.

Reference is made to FIG. 1. FIG. 1 is a schematic diagram of a testing device 100 according to some embodiments of the present disclosure. In some embodiments, the testing device 100 may be a design for test (DFT) circuitry that is formed in a single chip. In some embodiments, the testing device 100 is for high-speed data input/output (I/O) tests.

The testing device 100 includes a transmitter circuit 110, a loopback circuit 120, a pattern generator circuit 130, a receiver circuit 140, and a sampler circuit 150. The transmitter circuit 110 is configured to output data DOUT via pads $TX_1$ and $TX_2$. The receiver circuit 140 is configured to receive data DIN via pads $RX_1$ and $RX_2$. In some embodiments, the pads $TX_1$ and $TX_2$ may be output pads of a die where the testing device 100 is formed on, and the pads $RX_1$ and $RX_2$ may be input pads of the die.

The pattern generator circuit 130 is configured to generate test signals $S_{T1}$ and $S_{T2}$, and transmit the same to the transmitter circuit 110. In some embodiments, the test signals $S_{T1}$ and $S_{T2}$ may be signals that have specific patterns for testing I/O circuitry.

The loopback circuit 120 is coupled between the transmitter circuit 110 and the receiver circuit 140. In some embodiments, the loopback circuit 120 is enabled in response to an enable signal EN. The loopback circuit 120 is enabled to provide a connection between the transmitter circuit 110 and the receiver circuit 140, in order to loop signal(s) from the transmitter circuit 110 back to the receiver circuit 140.

For example, when the loopback circuit 120 is enabled, the receiver circuit 140 operates in a testing mode and receives test signals $S_{T3}$ and $S_{T4}$, such that a test on the transmitter circuit 110 and the receiver circuit 140 is started. Alternatively, when the loopback circuit 120 is not enabled, the receiver circuit 140 operates in a normal mode and receives the data DIN. In some embodiments, logic values of the test signals $S_{T3}$ and $S_{T4}$ are the same as the test signals $S_{T1}$ and $S_{T2}$ respectively. In some embodiments, the loopback circuit 120 outputs the test signals $S_{T3}$ and $S_{T4}$ in response to the test signals $S_{T1}$ and $S_{T2}$ correspondingly.

In some embodiments, as discussed below, the loopback circuit 120 is coupled to termination resistors of the receiver circuit 140 and input terminals of the sampler circuit 150. In some embodiments, the loopback circuit 120 is configured to cooperate with these termination resistors, in order to transmit the test signals $S_{T3}$ and $S_{T4}$ to the sampler circuit 150. As a result, the testing device 100 is able to be applied for high-speed test. An example of the loopback circuit 120 is provided with reference to FIG. 2 for further clarification.

The sampler circuit 150 is coupled to the loopback circuit 120 and the receiver circuit 140 to receive the test signal $S_{T3}$ and $S_{T4}$. The sampler circuit 150 is configured to sample the test signal $S_{T3}$ and $S_{T4}$, in order to output test data DT for subsequent analysis. In some embodiments, the sampler circuit 150 may be implemented with a comparator circuit.

Figure 2:
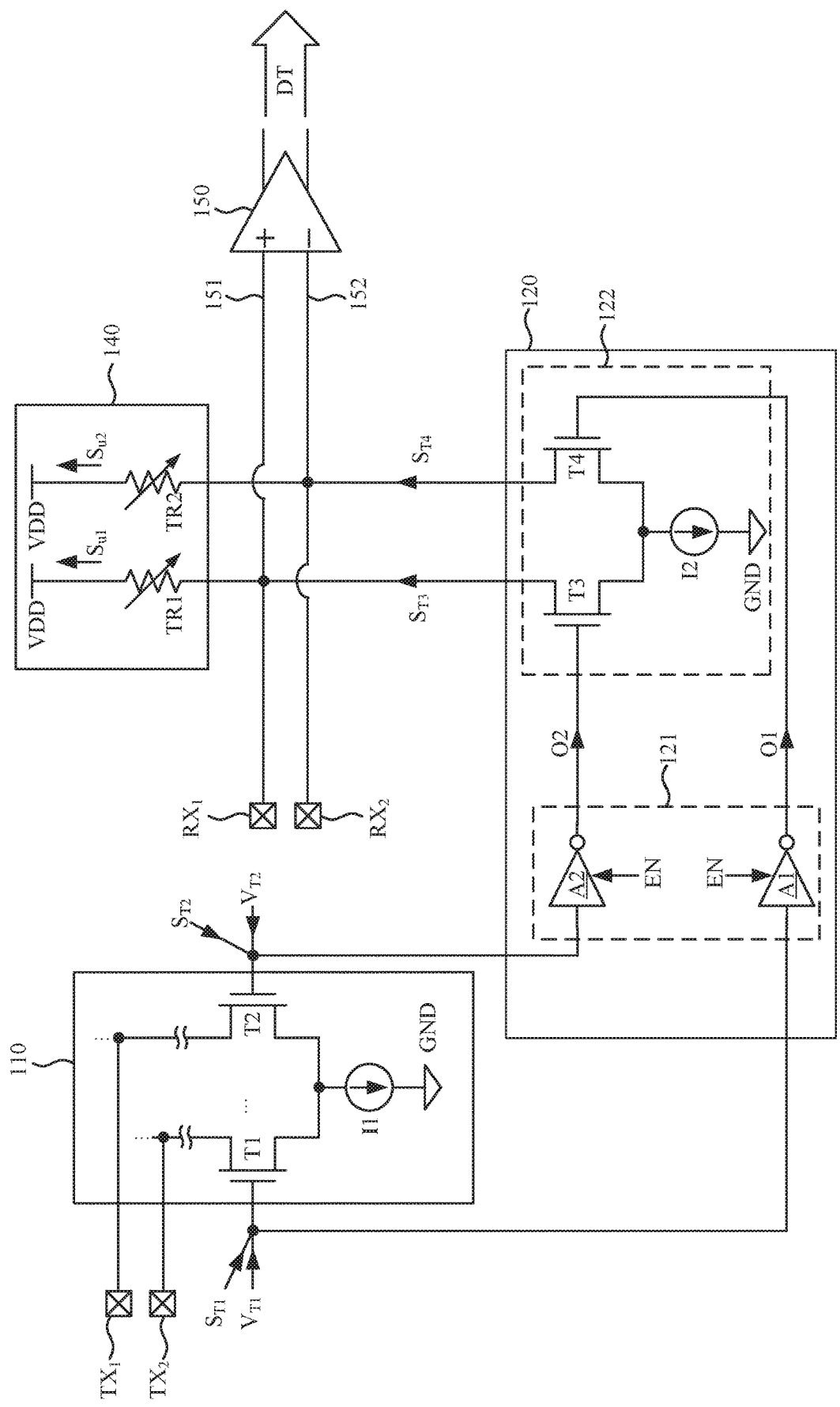
FIG. 2 is a circuit diagram of part of the testing device in FIG. 1 according to some embodiments of the present disclosure.

Reference is made to FIG. 2. FIG. 2 is a circuit diagram of part of the testing device 100 in FIG. 1 according to some embodiments of the present disclosure. For ease of understanding, like elements in FIGS. 1-2 are designated with the same reference number.

The transmitter circuit 110 includes transistors T1 and T2 and a current source circuit I1. The transistors T1 and T2 may be biased by the current source circuit I1, in order to operate as an input pair of a pre-driver. In the normal mode, the test signals $S_{T1}$ and $S_{T2}$ are de-asserted, and signals $V_{T1}$ and $V_{T2}$ are asserted. Under this condition, the transistors T1 and T2 receive the signals $V_{T1}$ and $V_{T2}$, and operate in response to the signals $V_{T1}$ and $V_{T2}$, respectively, to amplify the signals $V_{T1}$ and $V_{T2}$, in order to output the data DOUT via the pads $TX_T$ and $TX_2$. In the testing mode, the test signals $S_{T1}$ and $S_{T2}$ are asserted and the signals $V_{T1}$ and $V_{T2}$ are de-asserted. Under this condition, input terminals of the transistors T1 and T2 are configured to receive the test signals $S_{T1}$ and $S_{T2}$ from the pattern generator circuit 130, and the transistors T1 and T2 operate in response to the signals $S_{T1}$ and $S_{T2}$, respectively.

In some embodiments, asserting the signals $V_{T1}$ and $V_{T2}$ while de-asserting the test signals $S_{T1}$ and $S_{T2}$, and asserting the test signals $S_{T1}$ and $S_{T2}$ while de-asserting the signals $V_{T1}$ and $V_{T2}$, are performed by at least one multiplexer circuit. For example, the signals $S_{T1}$ and $V_{T1}$ are selected by a multiplexer, and the signals $S_{T2}$ and $V_{T2}$ are selected by another multiplexer.

In some embodiments, the receiver circuit 140 includes termination resistors TR1 and TR2. The termination resistor TR1 is coupled to the pad $RX_1$ and an input terminal 151 of the sampler circuit 150. The termination resistor TR2 is coupled to the pad $RX_2$ and an input terminal 152 of the sampler circuit 150. In some embodiments, the termination resistors TR1 and TR2 are configured to prevent signals received by the pads $RX_1$ and $RX_2$ from being reflected. In some embodiments, each of the termination resistors TR1 and TR2 may be implemented with a variable resistor. In some embodiments, each of the termination resistors TR1 and TR2 may be 50 ohm, but the present disclosure is not limited thereto.

The implementations and the values of the termination resistors TR1 and TR2 are given for illustrative purposes only. Various implementations and the values of the termination resistors TR1 and TR2 are within the contemplated scope of the present disclosure.

The loopback circuit 120 is coupled to control terminals of transistors T1 and T2 (e.g., input terminals of the transmitter circuit 110), the termination resistors TR1 and TR2, and the input terminals 151 and 152 of the sampler circuit 150. In some embodiments, the loopback circuit 120 includes a control circuit 121 and a driver circuit 122. The control circuit 121 is enabled by the enable signal EN, in order to output control signals O1 and O2 in response to the test signal $S_{T1}$ and $S_{T2}$. The driver circuit 122 generates the test signal $S_{T3}$ and $S_{T4}$ in response to the control signals O1 and O2.

For example, the control circuit 121 includes inverters A1 and A2. An input terminal of the inverter A1 is coupled to the control terminal of the transistor T1, in order to receive the test signal $S_{T1}$. The inverter A1 is enabled by the enable signal EN, and thus outputs the control signal O1 in response to the test signal $S_{T1}$. An input terminal of the inverter A2 is coupled to the control terminal of the transistor T2, in order to receive the test signal $S_{T2}$. The inverter A2 is enabled by the enable signal EN, and thus outputs the control signal O2 in response to the test signal $S_{T2}$.

The driver circuit 122 is coupled to the termination resistors TR1 and TR2 and the input terminals 151 and 152 of the sampler circuit 150. The driver circuit 122 includes transistors T3 and T4, and a current source circuit I2. A first terminal of the transistor T3 is coupled to the input terminal 151 of the sampler circuit 150, a second terminal of the transistor T3 is coupled to the current source circuit I2, and a control terminal of the transistor T3 is configured to receive the control signal O2. In response to the control signal O2, the transistor T3 is turned on or off to adjust a level of the input terminal 151, in order to generate the test signal $S_{T3}$. For example, if the test signal $S_{T2}$ has a logic value of 0, the control signal O2 has a logic value of 1. In response to this control signal O2, the transistor T3 is turned on to pull down the level of the input terminal 151 to the ground voltage GND via the current source circuit I2. Under this condition, the test signal $S_{T3}$ having the logic value of 0 is generated and transmitted to the input terminal 151. Alternatively, if the test signal $S_{T2}$ has the logic value of 1, the control signal O2 has the logic value of 0. In response to this control signal O2, the transistor T3 is turned off, and thus the level of the input terminal 151 is pulled up to a voltage VDD via the termination resistor TR1 (e.g., current signal $S_{u1}$). Under this condition, the test signal $S_{T3}$ having the logic value of 1 is generated and transmitted to the input terminal 151.

A first terminal of the transistor T4 is coupled to the input terminal 152 of the sampler circuit 150, a second terminal of the transistor T4 is coupled to a first terminal of the current source circuit I2, and a control terminal of the transistor T4 is configured to receive the control signal O1.

In response to the control signal O1, the transistor T4 is turned on or off to adjust a level of the input terminal 152, in order to generate the test signal $S_{T4}$. For example, if the test signal $S_{T1}$ has a logic value of 0, the control signal O1 has a logic value of 1. In response to this control signal O1, the transistor T4 is turned on to pull down the level of the input terminal 152 to the ground voltage GND via the current source circuit I2. Under this condition, the test signal $S_{T4}$ having the logic value of 0 is generated and transmitted to the input terminal 152. Alternatively, if the test signal $S_{T1}$ has the logic value of 1, the control signal O1 has the logic value of 0. In response to this control signal O1, the transistor T4 is turned off, and thus the level of the input terminal 152 is pulled up to a voltage VDD via the termination resistor TR2 (e.g., current signal $S_{u2}$). Under this condition, the test signal $S_{T4}$ having the logic value of 1 is generated and transmitted to the input terminal 152.

In this example, the sampler circuit 150 is implemented with a comparator circuit that compares the test signal $S_{T3}$ with the test signal $S_{T4}$, in order to generate the test data DT. In some embodiments, by comparing the test signal $S_{T3}$ with the test signal $S_{T4}$, a test pattern carried between the test signal $S_{T3}$ and the test signal $S_{T4}$ is able to be sampled.

In some related approaches, an additional multiplexer is employed and is arranged between a receiver and a loopback circuit, in order to couple an input signal path of the receiver to a transmitter. However, the additional multiplexer introduces parasitic capacitance and/or resistance to the receiver. As a result, the performance of the receiver is degraded, and thus the receiver is not suitable for high-speed data transmission.

In some embodiments, the loopback circuit 120 is directly coupled the pads $RX_1$ and $RX_2$ and the termination resistors TR1 and TR2. In practical applications, the pads $RX_1$ and $RX_2$ may include an electrostatic discharge (ESD) protection device (not shown) to avoid ESD damage. Under this condition, capacitances and/or resistances on nodes (e.g., input terminals 151 and 152) that are coupled to the pads $RX_1$ and $RX_2$ are substantially dominated by the ESD protection device. Accordingly, capacitances and/or resistances introduced from the loopback circuit 120 to these nodes can be negligible. As a result, the performance of the receiver circuit 140 is not significantly impacted by the loopback circuit 120.

In some other approaches, a transmitter and a receiver may be operated in different power domains, and thus an additional level shifter is required in a loopback test. Compared to these approaches, in some embodiments, as discussed above, the test signal $S_{T3}$ and $S_{T4}$ are generated in response to the current signal (e.g., $S_{u1}$, $S_{u2}$, and/or current of the current source circuit I2). Accordingly, no additional level shifter is needed in the loopback test. In other words, the loopback circuit 120 is able to run the loopback test in high-speed data transmission without the level shifter.

Figure 3:
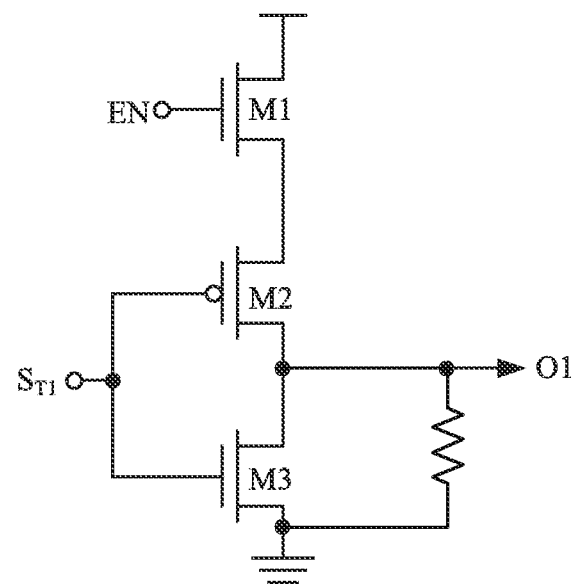
FIG. 3 is a circuit diagram of the inverter in FIG. 2 according to some embodiments of the present disclosure.

Reference is made to FIG. 3. FIG. 3 is a circuit diagram of the inverter A1 in FIG. 2 according to some embodiments of the present disclosure. For ease of understanding, like elements in FIGS. 2-3 are designated with the same reference number.

The inverter A1 includes transistors M1, M2, and M3. The transistors M2 and M3 are configured to operate as a normal inverter circuit. The transistor M1 is coupled to the transistors M2 and M3 in series, and is turned on according to the enable signal EN. The transistor M1 provides a power gating mechanism to the transistors M2 and M3. For example, when the transistor M1 is turned on, the transistors M2 and M3 are powered (e.g., enabled) to generate the control signal O1. Alternatively, when the transistor M1 is turned off, the transistors M2 and M3 are shut off. Circuit architecture of the inverter A2 may be the same as that of the inverter A1, and thus the repetitious descriptions are not given.

The embodiments of each figure are given for illustrative purposes, and the present disclosure is not limited to circuit configurations, transistor types (e.g., N type or P type) and/or transistor (e.g., field transistor, bipolar junction transistors) shown in each embodiment. Various circuit configurations that are able to achieve the same operations are within the contemplated scope of the present disclosure.

Figure 4:
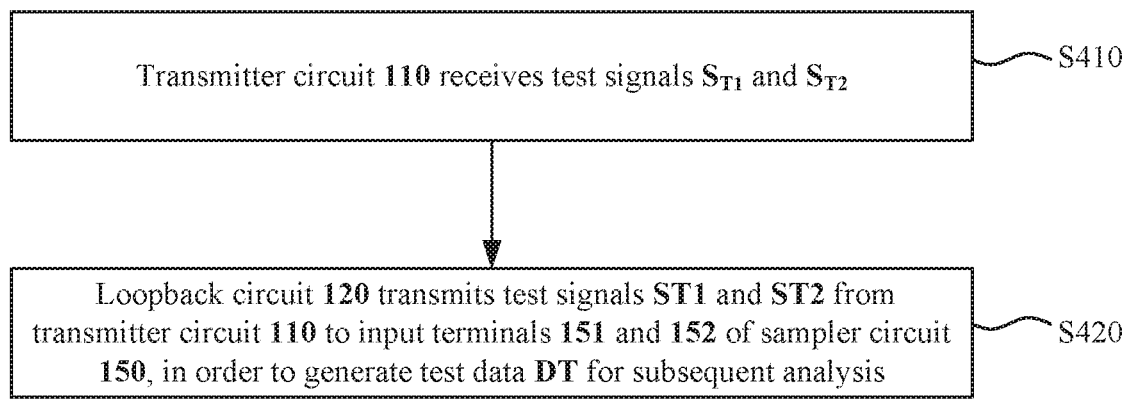
FIG. 4 is a flow chart of a testing method of some embodiments of the present disclosure.

Reference is made to FIG. 4. FIG. 4 is a flow chart of a testing method 400 of some embodiments of the present disclosure.

In operation S410, the transmitter circuit 110 receives the test signals $S_{T1}$ and $S_{T2}$.

In operation S420, the loopback circuit 120 transmits the test signals $S_{T1}$ and $S_{T2}$ from the transmitter circuit 110 to the input terminals 151 and 152 of the sampler circuit 150, in order to generate test data DT for subsequent analysis.

The above operations can be understood with reference to embodiments in FIGS. 1-3, and thus the repetitious descriptions are not given. The above description of the testing method 400 includes exemplary operations, but the operations of the testing method 400 are not necessarily performed in the order described above. The order of the operations of the testing method 400 can be changed, or the operations can be executed simultaneously or partially simultaneously as appropriate, in accordance with the spirit and scope of various embodiments of the present disclosure.

As described above, the testing device and the testing method provided in some embodiments of the present disclosure are able to be applied for loopback high-speed data transmission.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A testing device, comprising:
a transmitter circuit comprising input terminals and configured to receive a plurality of first test signals at the input terminals;
a receiver circuit configured to receive input data from a plurality of pads in a normal mode; and
a loopback circuit is directly coupled to the input terminals of the transmitter circuit to receive the plurality of first test signals at the input terminals of the transmitter circuit, wherein the loopback circuit is further directly coupled to the plurality of pads, the receiver circuit, and input terminals of a sampler circuit, wherein the loopback circuit is configured to output a plurality of second test signals in response to the plurality of first test signals to the receiver circuit and to the input terminals of the sampler circuit, in order to generate test data for subsequent analysis, wherein the loopback circuit comprises:

a control circuit configured to be enabled by an enable signal and generate a plurality of control signals in response to the plurality of first test signals; and a driver circuit configured to generate the plurality of second test signals in response to the plurality of control signals, and transmit the plurality of second test signals to the input terminals of the sampler circuit.

2. The testing device of claim 1, wherein the receiver circuit comprises a plurality of termination resistors coupled to the plurality of pads respectively.

3. The testing device of claim 2, wherein the loopback circuit is configured to cooperate with the plurality of termination resistors, in order to transmit the plurality of first test signals to the input terminals of the sampler circuit.

4. The testing device of claim 2, wherein the loopback circuit is directly coupled to the plurality of termination resistors.

5. The testing device of claim 1, wherein the loopback circuit is configured to transmit the plurality of first test signals to the input terminals of the sampler circuit without a level shifter.

6. The testing device of claim 1, wherein the control circuit comprises:

a first inverter configured to be enabled according to the enable signal, in order to generate a first control signal of the plurality of control signals in response to a first signal of the plurality of first test signals; and a second inverter configured to be enabled according to the enable signal, in order to generate a second control signal of the plurality of control signals in response to a second signal of the plurality of first test signals.

7. The testing device of claim 1, wherein the driver circuit comprises:

a first transistor configured to be turned on or off in response to a first control signal of the plurality of control signals, in order to generate a first signal of the plurality of second test signals;

a second transistor configured to be turned on or off in response to a second control signal of the plurality of control signals, in order to generate a second signal of the plurality of second test signals; and a current source circuit coupled to the first transistor and the second transistor.

8. The testing device of claim 1, wherein logic values of the plurality of second test signals are the same as logic values of the plurality of first test signals.

9. A testing method, comprising:

receiving, by a transmitter circuit, a plurality of first test signals at input terminals of the transmitter circuit;

receiving, by a loopback circuit, the plurality of first test signals at the input terminals of the transmitter circuit, wherein the loopback circuit is directly coupled to the input terminals of the transmitter circuit; and outputting, by the loopback circuit, a plurality of second test signals in response to the plurality of first test signals to a receiver circuit and to input terminals of a sampler circuit, in order to generate test data for subsequent analysis, comprising:

enabling a control circuit of the loopback circuit by an enable signal;

generating, by the control circuit, a plurality of control signals in response to the plurality of first test signals; and generating, by a driver circuit of the loopback circuit, the plurality of second test signals in response to the plurality of control signals, and transmit the plurality of second test signals to the input terminals of the sampler circuit, wherein the loopback circuit is directly coupled to a plurality of pads corresponding to the receiver circuit, the receiver circuit, and the input terminals of the sampler circuit.

10. The testing method of claim 9, wherein the plurality of pads are coupled to a plurality of termination resistors respectively.

11. The testing method of claim 10, wherein transmitting the plurality of first test signals from the transmitter circuit to the input terminals of the sampler circuit comprises:

cooperating, by the loopback circuit, with the plurality of termination resistors, in order to transmit the plurality of first test signals to the input terminals of the sampler circuit.

12. The testing method of claim 10, wherein the loopback circuit is directly coupled to the plurality of termination resistors.

13. The testing method of claim 9, wherein the plurality of first test signals are transmitted to the input terminals of the sampler circuit without a level shifter.

14. The testing method of claim 9, wherein enabling the control circuit of the loopback circuit by the enable signal comprises:

enabling a first inverter of the control circuit according to the enable signal, in order to generate a first control signal of the plurality of control signals in response to a first signal of the plurality of first test signals; and enabling a second inverter of the control circuit according to the enable signal, in order to generate a second control signal of the plurality of control signals in response to a second signal of the plurality of first test signals.

15. The testing method of claim 9, wherein generating the plurality of second test signals in response to the plurality of control signals comprises:

turning on or off a first transistor of the driver circuit in response to a first control signal of the plurality of control signals, in order to generate a first signal of the plurality of second test signals; and turning on or off a second transistor of the driver circuit in response to a second control signal of the plurality of control signals, in order to generate a second signal of the plurality of second test signals.

16. The testing method of claim 9, wherein logic values of the plurality of second test signals are the same as logic values of the plurality of first test signals.

* * * * *